United States Patent
DiCarlo et al.

(10) Patent No.: US 6,650,115 B2
(45) Date of Patent: Nov. 18, 2003

(54) VARIABLE DENSITY FOURIER VELOCITY ENCODING MR IMAGING

(75) Inventors: Julie Camille DiCarlo, Stanford, CA (US); Dwight G. Nishimura, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 63 days.

(21) Appl. No.: 09/976,485

(22) Filed: Oct. 12, 2001

(65) Prior Publication Data

US 2003/0071618 A1 Apr. 17, 2003

(51) Int. Cl.[7] .................................................. G01V 3/00
(52) U.S. Cl. ...................................................... 324/307
(58) Field of Search ................................ 324/307, 309, 324/306

(56) References Cited

U.S. PATENT DOCUMENTS

| | | | |
|---|---|---|---|
| 4,713,615 A | * 12/1987 | Barratt et al. | 324/307 |
| 4,952,876 A | * 8/1990 | Pelc | 324/309 |
| 5,055,790 A | * 10/1991 | Siuciak et al. | 324/309 |
| 5,133,357 A | * 7/1992 | Dumoulin et al. | 600/413 |
| 5,170,122 A | * 12/1992 | Bernstein | 324/309 |
| 5,225,779 A | * 7/1993 | Parker et al. | 324/306 |
| 5,233,298 A | * 8/1993 | Dumoulin | 324/306 |
| 5,291,891 A | * 3/1994 | Foo et al. | 600/410 |
| 5,309,099 A | 5/1994 | Irarrazabal et al. | |
| 5,432,448 A | * 7/1995 | Heid et al. | 324/309 |
| 5,952,827 A | * 9/1999 | Feinberg | 324/309 |
| 6,141,578 A | * 10/2000 | Hardy | 600/410 |
| 6,265,872 B1 | * 7/2001 | Heid | 324/307 |
| 6,310,479 B1 | * 10/2001 | Zhu et al. | 324/312 |
| 6,408,201 B1 | * 6/2002 | Foo et al. | 600/410 |

OTHER PUBLICATIONS

Luk–Pat, Gerard T. et al., "One–Shot Spatially Resolved Velocity Imaging," Magnetic Resonance in Medicine 40:603–613 (1998).

Sabataitis, J.C. et al., "One–Shot Velocity Encoding Using a Variable Density Trajectory," 9th Meeting ISMRM, 1 p. Apr. 21, 2001.

* cited by examiner

Primary Examiner—Diego Gutierrez
Assistant Examiner—Dixomara Vargas
(74) Attorney, Agent, or Firm—Beyer Weaver & Thomas, LLP

(57) ABSTRACT

Real time spatially localized velocity distribution is measured using magnetic resonance techniques by first exciting a column-shaped region using a 2D RF excitation pulse. A cyclical readout gradient is then played along the excited column's axis while the magnetic resonance signal is continuously sampled to create a 2D sample set of velocity frequency vs. spatial frequencies in the same direction. If the cyclical readout gradient, for example a sawtooth-shaped gradient, has lobes of increasing area, the spacing between samples in the velocity-frequency direction is increased to emphasize sampling at low velocity-frequency and to more coarsely sample high velocity-frequencies. The sequence can be repeated to collect a time series of velocity-position images, which can then be sampled to create a velocity-time image at a single location.

12 Claims, 2 Drawing Sheets

Sequence diagram for variable-density one-shot FVE

Sequence diagram for one-shot FVE

Sequence diagram for variable-density one-shot FVE

VARIABLE DENSITY FOURIER VELOCITY ENCODING MR IMAGING

The U.S. Government has rights in the disclosed invention pursuant to NIH Grant No. 5ROI HL47448 to Stanford University.

BACKGROUND OF THE INVENTION

This invention relates generally to magnetic resonance imaging, and more particularly the invention relates to determining real time spatially localized velocity distribution in a region using magnetic resonance (MR) measurements.

Quantitative velocity measurements are important in diagnosing a range of cardiovascular diseases. In stenotic mitral and aortic valves, velocities can increase from normal levels of 1 m/s to 3–4 m/s. Congenital heart disease such as coarctation can be detected by measuring high velocity in the ascending aorta, and pulmonary hypertension can be determined by the presence of high velocity tricuspid regurgitation jets.

Heretofore, the accurate measurement and localization of blood flow velocities has been achieved with Doppler ultrasonography which has found wide application in medical diagnosis. However, a variety of MR techniques have been employed to obtain velocity information.

U.S. Pat. No. 5,309,099 to frarrazabal, Hu, and Pauly discloses MR Fourier velocity encoding (FVE) which uses signal phase to encode velocity and thus results in a 3-D data set for a 2-D velocity map. If imaging is restricted along one spatial dimension, a 2-D data set of velocity as a function of position is acquired and imaging time is greatly reduced. Instead of collecting spatial frequencies (k-space comprised of $k_x$ and $k_y$) a plane containing velocity frequencies as a function of spatial frequencies in the direction of velocity ($k_{yz}$ vs. $k_z$) is acquired and reconstructed to obtain a series of velocity versus location images, which can then be temporally sampled to produce a velocity-time image at one location.

Lukpat, Pauly, Hu, and Nishimura, MRM, 40; 603–613, 1998 disclose one shot spatially resolved velocity imaging. The technique is similar to that disclosed in the two-shot imaging of U.S. Pat. No. 5,309,099, supra, except that single shot FVE with a bipolar prewinder produces a time series of velocity vs. spatial location images. The pulse sequence diagram is shown in FIG. 1. The sequence first restricts imaging to one dimension using a selective excitation. Oscillating gradients on two axes are used to create a cylindrical excitation along the third axis. The cylindrical excitation is aligned with the vessel wall, then a sawtooth readout gradient along the excitation axis is played to record a one-dimensional image down the length of the vessel. The gradient lobes have the same area and cause a back and forth motion in the spatial frequency direction. However, the gradient also results in an oscillating, magnitude increasing first moment. The first moment of the gradient is proportional to velocity frequency. Therefore, the zero and first moments result in a bowtie-shaped trajectory through spatial frequency and velocity frequency.

The present invention is directed to FVE MR imaging which allows finer object resolution while maintaining a shorter imaging time.

BRIEF SUMMARY OF THE INVENTION

In accordance with the invention, an RF excitation pulse is applied to a region of interest in the presence of two orthogonal axial gradients which create a cylindrical excitation along a third axis, which can be aligned with a blood vessel such as the aorta. After excitation of the nuclei spins, the two orthogonal gradients are removed and a readout gradient is applied along the readout axis. The readout gradient is a continuous time varying cyclical gradient, such as a sawtooth wave form. In accordance with the invention, the readout gradient has lobes of increasing width which result in k-space sampling trajectories, or spokes of a bowtie, configuration with nonuniform spacing of the spokes whereby sampling density is higher at lower velocity frequencies in k-space. The variable density trajectories can provide a finer velocity resolution and maintain a shorter imaging time.

The invention and objects and features thereof will be more readily apparent from the following detailed description and appended claims when taken with the drawings.

DETAILED DESCRIPTION OF THE INVENTION

Figure 2A:
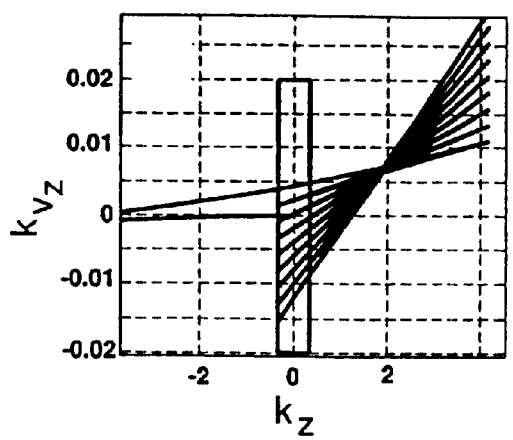
FIGS. 2(a)–2(c) illustrate k-space trajectories with uniform and varying spoke spacing in accordance with the present invention.

FIG. 2(a) illustrates the bowtie based trajectory and the rectangular region from which data are taken for image reconstruction as disclosed by Lukpat et al., supra. The trajectories or spokes of the bowtie are equally spaced along the $k_{yz}$ axis, which uniformly samples k-space.

Figure 2B:
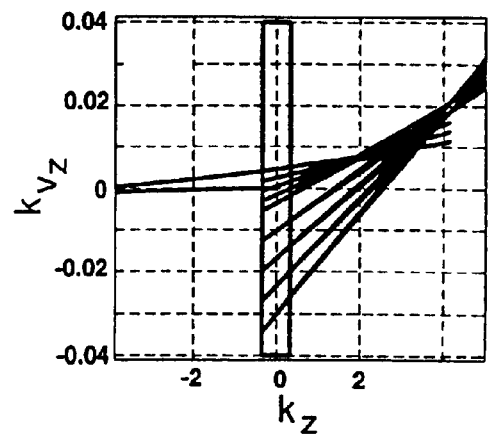
Figure 2C:
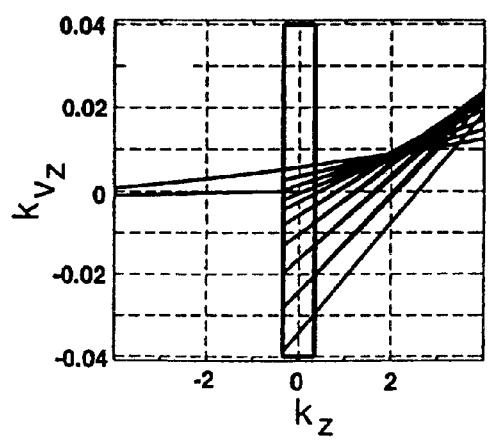

In accordance with the invention, variable density trajectories are used in FVE sequences to achieve finer velocity resolution while maintaining a shorter imaging time. These trajectories do not sample k-space uniformly along $k_{yz}$, but vary their speed through k-space depending on their location, as illustrated in FIGS. 2(b) and 2(c). These variable density sequences sample $k_{yz}$ with highest sampling density at low velocity-frequencies. Coarse sampling at high velocity-frequencies will result in aliasing image artifacts, however, most velocity distributions have a frequency spectrum that is most concentrated at low velocity-frequencies, and aliasing of high velocity frequencies is small, resulting in little image artifact. In FIG. 2(b), the variable density one-shot FVE has different uniform spoke spacings at low and high velocity frequencies, while in FIG. 2(c), variable density FVE has linearly decreasing velocity-FOV above a given velocity frequency.

Figure 3:
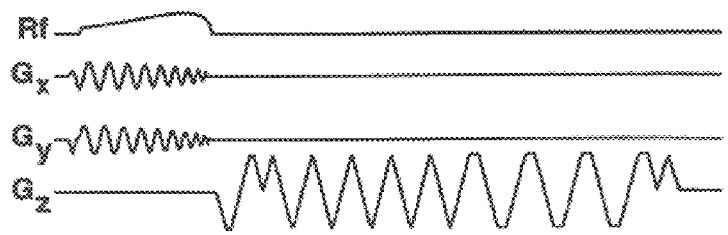
FIG. 3 illustrates a pulse sequence for real time spatially localized velocity distribution acquisition in accordance with an embodiment of the present invention.

The trajectory in accordance with the invention has progressively increasing areas of the lobes comprising the sawtooth or cyclical gradient during the readout, as shown in FIG. 3. This increases the spacing between spokes, decreasing the velocity FOV at each location but allowing for sampling of higher velocity frequencies. The sequence is much like the Lukpat et al. sequence, which obtains a series of velocity-location images which are used to assemble a velocity time image. However, the Lukpat et al. sequence uses uniform lobe area in the readout gradient, which provides uniform spacing of the k-space trajectories. The nonuniform lobes of the readout gradient in accordance with the invention, which results in variable spacing of the k-space trajectories and an emphasis on low frequency sampling achieves finer velocity resolution for a fixed readout time and velocity FOV, or alternatively, an increase can be realized in the amount of velocity FOV while maintaining the velocity resolution and readout time constant.

Figure 5A:
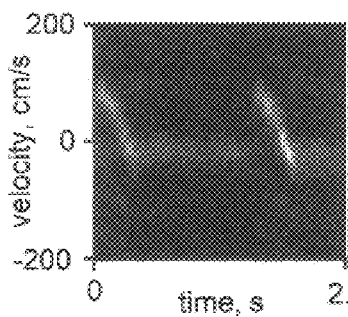
FIGS. 5(a)–5(c) illustrate images reconstructed using a uniform-density trajectory, a variable-density trajectory with larger velocity-FOV, and a variable-density with double velocity resolution.
Figure 5B:
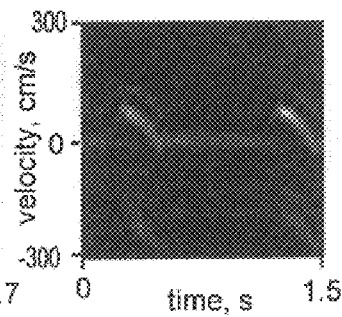
Figure 5C:
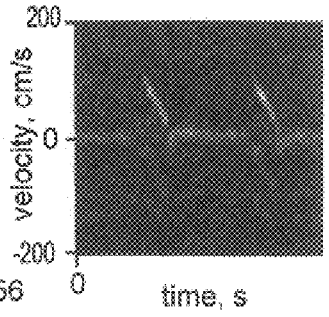

This is illustrated in FIGS. 5(a)–5(c), with FIG. 5(a) being an image of velocity using the Lukpat et al. sequence with uniform sampling, FIG. 5(b) utilizes a variable density with the same velocity resolution but 50% wider velocity FOV, and FIG. 5(c) is a variable density image with the same velocity FOV but with double velocity resolution.

Figure 4A:
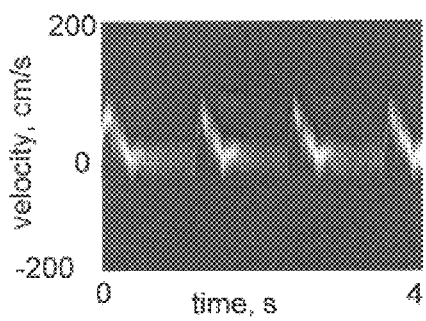
FIGS. 4(a)–4(c) illustrate images reconstructed using the uniform density and variable density trajectories of FIGS. 2(a)–2(c).
Figure 4B:
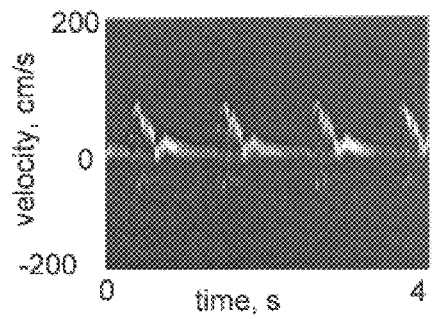
Figure 4C:
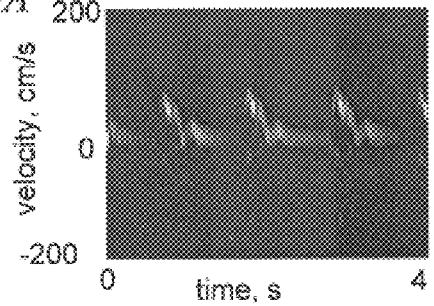

Flow profiles across blood vessels have been studied for quite some time and have been shown to vary smoothly across the vessel cross-section. Since a small volume of blood cannot travel with a drastically different velocity than a neighboring small blood volume, the velocity frequency spectrum is also concentrated at low velocity frequencies. Because we sample high velocity frequencies more coarsely than low velocity frequencies, aliasing of high velocity frequencies is low. We can therefore vary our trajectory to achieve higher velocity resolution while maintaining a velocity FOV that can measure high velocity flow. We can change the spacing of the spokes above a certain velocity frequency, as in FIG. 2(b), effectively creating two sequential bowtie trajectories with uniform but different spoke spacings. Here, we can calculate the unaliased velocity FOV and the aliased FOV, or the minimum velocity that will result in aliasing if it causes signal above the velocity frequency at which the transition takes place. In order to minimize aliasing, we can use a slightly longer readout (longer by about 0.5 ms,) and linearly increase the spoke separation from the original spacing to any factor times the original spacing, as shown in the trajectory of FIG. 2(c). The smoother transition will linearly decrease the velocity FOV after the determined velocity frequency, and, depending on the velocities present, will generally result in even lower aliasing artifact. FIGS. 4(a)–4(c) illustrate images reconstructed using the uniform density and variable density trajectories of FIGS. 2(a)–2(c).

Figure 1:
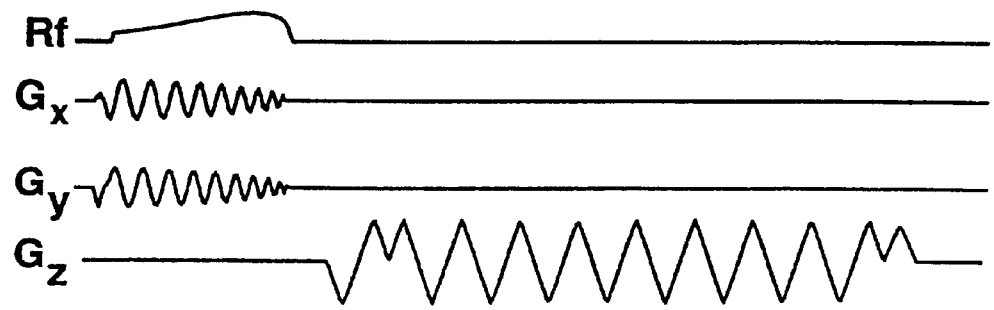
FIG. 1 illustrates a pulse sequence for real time spatially localized velocity distribution acquisition in accordance with the prior art.

Velocity-FOV is determined by the maximum spacing of spokes in the bowtie trajectory. This occurs at the edge of the bowtie, at the lowest spatial frequency, as shown in FIG. 2(a). The velocity-FOV for the higher velocity-frequencies can also be determined by the increased spacing as shown in FIG. 2(b). By applying the variable-density principle to the sequence shown in FIG. 1, we obtain the sequence shown in FIG. 3, which results in double the velocity resolution with an increase in readout time of only 20 percent.

If off-resonance is less of a concern, a variable-density trajectory can be applied to the two-shot sequence described in Irarrazabal et al., U.S. Pat. No. 5,309,099. In this case, even greater velocity resolution can be obtained. The two-shot sequence uses the first excitation/readout to acquire the bottom half of the reconstructed k-space, and another shifted version to acquire the top half. The top and bottom halves can be each acquired with a trajectory that becomes coarser at higher frequencies. Alternatively, if a partial k-space reconstruction is used, a closely-spaced trajectory can be used to acquire positive and negative low velocity frequencies, and a varying, coarser trajectory can be used for higher velocity-frequencies during the second shot to achieve even higher velocity resolution.

We have described a method for applying variable-density in MR sequences to velocity encoding. Since the velocity profile is smoothly varying, velocity frequency is concentrated at low frequencies and aliasing of high velocity-frequency signal is low. The modification of the trajectory to variable-density allows finer velocity resolution for the same readout time and velocity FOV, or an increase velocity FOV for the same readout time and velocity resolution.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of measuring real-time spatially localized velocity distribution in a region of a body comprising the steps of:
    (a) placing said body in a static magnetic field along a first axis (z),
    (b) applying magnetic gradient pulses along two orthogonal axes (x,y) and an RF excitation pulse to selectively excite said region,
    (c) applying a cyclical magnetic readout gradient along an excitation axis, said gradient having lobes with increasing area,
    (d) sampling a magnetic resonance signal while applying said readout gradient, said magnetic resonance signal including velocity distribution along a spatial dimension on said readout axis, and
    (e) obtaining a velocity distribution along said spatial dimension.

2. The method as defined by claim 1 wherein step (c) applies a sawtooth shaped gradient.

3. The method as defined by claim 2 wherein step (c) applies a sawtooth shaped gradient including a bipolar prewinder before the cyclical gradient.

4. The method as defined by claim 3 wherein step (c) provides a k-space trajectory as a function of position and velocity.

5. The method as defined by claim 4 wherein step (e) includes a Fourier transform of said k-space trajectory.

6. The method as defined by claim 5 wherein step (b) excites a Gaussian cylinder.

7. The method as defined by claim 6 wherein step (c) applies a readout gradient along the axis of said Gaussian cylinder.

8. The method as defined by claim 1 wherein step (c) provides a k-space trajectory as a function of position and velocity.

9. The method as defined by claim 8 wherein step (e) includes a Fourier transform of said k-space trajectory.

10. The method as defined by claim 9 wherein step (b) excites a Gaussian cylinder.

11. The method as defined by claim 10 wherein step (c) applies a readout gradient along the axis of said Gaussian cylinder.

12. The method as defined by claim 1 wherein steps (b), (c), and (d) are repeated with step (b) alternatively inverting said magnetic gradient.

* * * * *